United States Patent [19]

Suter

[11] Patent Number: 4,870,372

[45] Date of Patent: Sep. 26, 1989

[54] AGC DELAY ON AN INTEGRATED CIRCUIT

[75] Inventor: Richard R. Suter, Beaverton, Oreg.

[73] Assignee: AT&E Corporation, San Francisco, Calif.

[21] Appl. No.: 196,946

[22] Filed: May 20, 1988

[51] Int. Cl.$^4$ .............................................. H03G 3/30
[52] U.S. Cl. .................................... 330/280; 330/133; 330/138; 330/307
[58] Field of Search ............... 330/133, 138, 254, 280, 330/307, 252; 455/242, 243; 340/311.1; 307/355, 360, 363

[56] References Cited

U.S. PATENT DOCUMENTS

| | | | |
|---|---|---|---|
| 4,152,667 | 5/1979 | Visser | 330/280 X |
| 4,327,333 | 4/1982 | Wilcox | 330/278 |
| 4,563,597 | 1/1986 | Betzold | 330/252 X |
| 4,746,873 | 5/1988 | Cowley | 329/110 |

FOREIGN PATENT DOCUMENTS 146005  7/1986  Japan ................................... 330/252

*Primary Examiner*—James B. Mullins
*Attorney, Agent, or Firm*—Klarquist, Sparkman, Campbell, Leigh & Whinston

[57] ABSTRACT

Circuitry is disclosed for staggering the onset of gain reduction in a series of cascaded gain stages as a function of received signal strength. The staggering is effected by controlling the area ratio between corresponding components in two or more AGC control circuits whose topologies are otherwise identical. The technique is particularly well suited for use in radio receivers fabricated in integrated circuit form.

10 Claims, 3 Drawing Sheets

AGC DELAY ON AN INTEGRATED CIRCUIT

FIELD OF THE INVENTION

The present invention relates to radio receivers, and more particularly relates to the automatic gain control (AGC) circuitry used in such receivers.

BACKGROUND AND SUMMARY OF THE INVENTION

Many radio receivers and amplifiers have an AGC feature for reducing the amplification of one or more gain stages to compensate for the varying levels of signal intensity that may be received. Such AGC circuits permit modern receivers to have dynamic ranges in excess of 100 dB.

In certain applications, particularly at high frequencies and low signal strengths, the noise figure of the receiver becomes an important consideration. The receiver noise figure is most directly affected by the gain of the receiver front end. Consequently, it is desirable to operate the front ends of sensitive receivers at maximum gains and to gain control subsequent stages. Only after the received signal strength is so large that noise figure is not an important issue should gain reduction occur in the front end stage.

Prior art systems typically address the noise figure problem by running the front end stage without any gain control whatsoever. While optimizing the noise figure, such an approach degrades the overall system dynamic range since signals above a certain threshold overwhelm the receiver. Thus, there is a continuing need for improved AGC systems that will progressively reduce the gain of the amplifier stages, beginning with those stages most remote from the front end.

Accordingly, it is an object of the present invention to provide an improved AGC system for receivers which will progressively reduce the gain in the amplifier stages, beginning first with the stages most remote from the front end.

It is a further object of the present invention to provide such an improved AGC system with a high degree of noise immunity.

It is still a further object of the present invention to provide such an improved AGC system that can be fully implemented using integrated circuit fabrication techniques.

According to the present invention, the staggering of the onset of gain reduction in a series of cascaded gain stages is effected by controlling the area ratio between corresponding components in two or more AGC control circuits whose topologies are otherwise similar. A representative AGC control circuit may include two transistors in a differential common-emitter configuration. The bases of the transistors are driven from a signal related to the amplitude of signal being received by the receiver. The collectors of the transistors provide a differential AGC output signal controllably offset from the input signal by a voltage determined by the area ratio between the two transistors. The differential configuration is preferably employed to reject common mode signals and thus to improve noise immunity. Several such AGC circuits can be employed to cause different amplifier stages in the receiver to begin significant gain reduction at different received signal thresholds.

The foregoing and other objects, features and advantages of the present invention will be more readily apparent from the following detailed description, which proceeds with reference to the accompanying drawings.

DESCRIPTION

Figure 1:
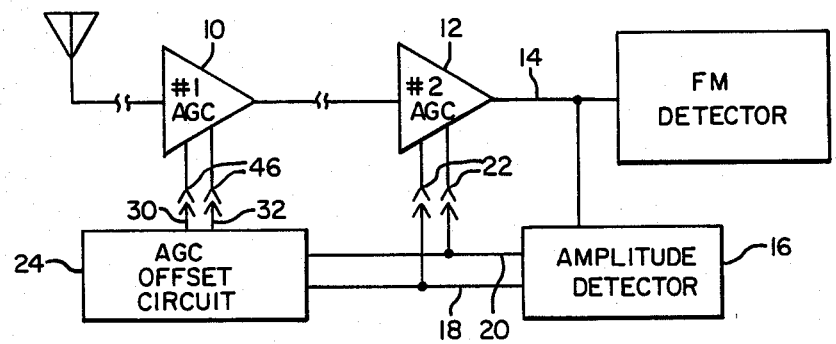
FIG. 1 is a block diagram showing an exemplary receiver configuration employing the AGC control system of the present invention.

Referring to FIG. 1, a basic receiver topology is illustrated which includes first and second cascaded amplifier stages 10, 12 In a typical embodiment, amplifier 10 may be the RF front end stage and amplifier 12 may be one or more amplifiers in the IF amplifier. Coupled to an output 14 of amplifier 12 is an amplitude detector stage 16. Amplitude detector stage 16 produces a differential output signal on first and second output lines 18, 20, the magnitude of which is related to the amplitude of the signal output from amplifier stage 12.

In the embodiment illustrated in FIG. 1, the output signal provided on lines 18 and 20 is applied directly to an AGC input 22 of second amplifier stage 12. As the signal on lines 18, 20 increases, the gain of second amplifier stage 12 decreases, thereby reducing fluctuations in the output signal provided to line 14.

(For purposes of the present discussion, it is assumed that the amplifier stages 10, 12 are designed to begin substantial gain reductions when the AGC voltages applied thereto exceed zero volts. In an exemplary embodiment, the gain at zero volts AGC may be from zero to three dB below maximum, a value still considered relatively insignificant.)

Figure 2:
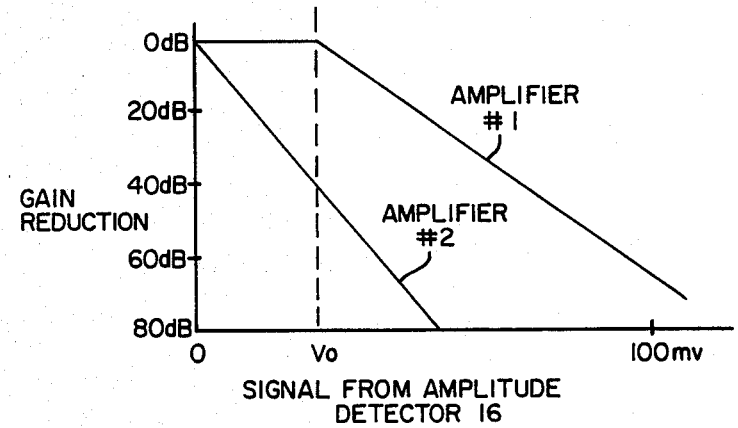
FIG. 2 is a chart showing gain reduction in first and second cascaded gain stages as a function of received signal strength in a receiver using an AGC circuit according to the present invention.

As noted in the Background discussion, it is desirable that the gain of second amplifier stage 12 be reduced prior to the reduction of gain in amplifier stage 10 if system noise figure is to be optimized. The chart shown in FIG. 2 illustrates an exemplary relationship between the AGC signals applied to the first and second amplifier stages to accomplish this effect. As can be seen, the first amplifier stage 10 does not have any significant gain reduction when the signal from amplitude detector 16 is below a threshold indicated as $V_o$. In this range, however, the second amplifier stage 12 steadily reduces its gain as the signal from amplitude detector 16 increases. By this arrangement, first amplifier 10 operates at substantially full gain until the received signal strength is large enough that system noise figure is not important. Only after the signal exceeds the threshold indicated by $V_o$ do both amplifier stages reduce gain.

In this example, the slope of the line indicating the gain reduction in second amplifier 12 is solely a function of the amplifier's response to AGC signals. The slope of the line indicating the gain reduction in first amplifier 10, however, can be controlled by the transfer characteristics of the AGC control circuit that provides the AGC voltage to the first amplifier.

Returning to FIG. 1, it can be seen that the AGC input 22 of second amplifier stage 12 is driven directly from the output of amplitude detector 16. Consequently, second amplifier stage 12 begins AGC control without any threshold. An AGC control circuit 24, however, is connected to lines 18 and 20 and delays the onset of significant gain reduction in first amplifier stage 10 until the signal from amplitude detector 16 exceeds the threshold $V_o$ shown in the chart of FIG. 2.

Figure 3:
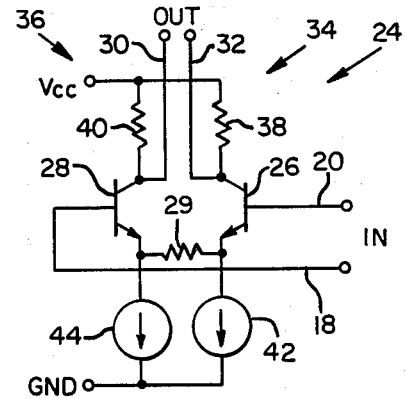
FIG. 3 is an electrical schematic diagram of an AGC circuit according to the present invention.

FIG. 3 shows an electrical schematic representation of AGC control circuit 24. This circuit comprises first and second transistors 26, 28 arranged in a differential configuration with an optional gain setting element 29 coupling the emitters. The bases of transistors 26, 28 are driven from lines 18, 20 from amplitude detector 16. The AGC output signals are provided from the transistor collectors to output lines 30, 32.

In most differential amplifier topologies, the circuitry is symmetrical, producing a mirroring of the currents in the two complementary halves 34, 36. In the present invention, however, the complementary halves are not identical. Instead, in the preferred embodiment, one of transistors 26, 28 has a saturation current different from the other.

Reverting a minute to circuit theory, a fundamental relationship in transistor design is that:

$$V_{be} = V_t \ln(I_c/I_s)$$

where $V_t$ is a thermal voltage constant (0.026 volts at room temperature), $I_c$ is collector current and $I_s$ is the saturation current of the transistor device. Since the difference in voltage between lines 18 and 20 is equal to the difference in $V_{be}$ between transistors 26 and 28, the above equation makes clear that:

$$\Delta V_{be} = V_T \ln \text{ (saturation current ratio).}$$

If the circuit of FIG. 3 is to produce a zero volt output signal on its differential output lines 30, 32, the collector currents of transistors 26 and 28 must be equal (assuming the circuits 34, 36 are otherwise identical). The collector currents will be equal when the differential voltage applied on lines 18, 20 is equal to the $\Delta V_{be}$ value above. Thus, in an exemplary system using transistors having saturation current ratios of 2:1 operating at room temperature, the signal applied to input lines 18, 20 required to produce a zero volt output signal on lines 30, 32 is eighteen millivolts.

Returning again to FIG. 1, it can be appreciated that an AGC signal of up to eighteen millivolts can be present on lines 18, 20 (and thus applied to reduce the gain of second amplifier stage 12) before the AGC signal applied to first amplifier stage 10 rises above zero volts. By this offsetting arrangement, AGC action in the two stages is staggered relative to each other as a function of received signal strength.

In alternative embodiments, it will be recognized that a similar effect can be achieved by varying the ratios of other components in complementary circuits 34, 36, such as the ratios between collector loads 38 and 40 (which in the illustrated embodiment have values of 1 kilohms), or between current sources 42 and 44 (which in the illustrated embodiment provide constant currents of 100 μA). In integrated circuit fabrication of the circuit (the preferred construction technique) such ratios are more readily controlled than the absolute value of any particular circuit component.

Returning to FIG. 1, it will be recognized that second amplifier stage 12 is AGC controlled directly from the output of amplitude detector 16. Thus, second amplifier stage 12 will begin gain reduction when any signal is present. In most applications, however, it is desirable to delay the onset of gain reduction, even in second stage 12, until the received signal exceeds a first threshold. To achieve this end, gain stage 12 can be designed to ignore AGC signals below a predetermined threshold. An alternative approach is to include an AGC control circuit such as that illustrated in FIG. 3 within amplitude detector 16 so that a gain reducing signal does not appear on lines 18 and 20 until the amplitude of signal output by second amplifier 12 exceeds a predetermined threshold. Illustrated AGC control circuit 24 can then be cascaded onto the output of the AGC control circuit in the amplitude detector 16.

Figure 4:
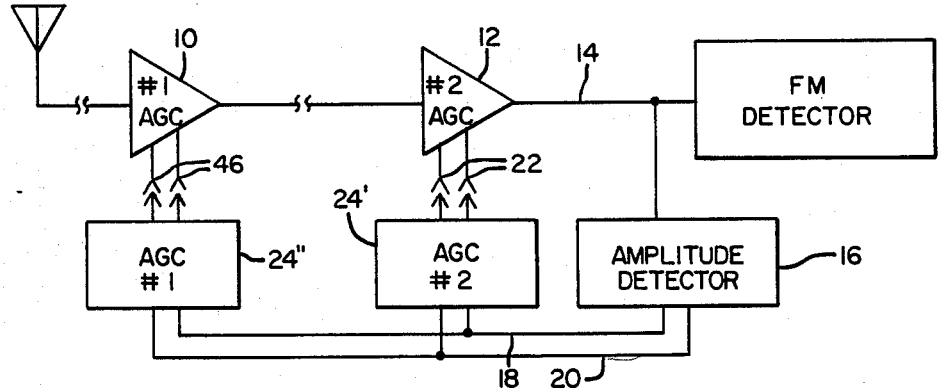
FIG. 4 is an alternative receiver configuration employing an AGC system according to the present invention.

Still another technique for effecting the AGC staggering result is to use the arrangement shown in FIG. 4. In this system, the output signal on lines 18, 20 from amplitude detector 16 is not applied directly to AGC inputs 22 of second amplifier stage 12. Instead, an AGC control circuit 24', such as that shown in FIG. 3, is interposed. AGC control circuit 24' can be designed, for example, with a 2:1 area ratio so that the circuit does not provide a gain-reducing signal to second amplifier stage 12 until the signal on lines 18, 20 exceeds eighteen millivolts.

A separate AGC control circuit 24" can be interposed between lines 18, 20 and the AGC inputs 46 of first amplifier stage 10. AGC control circuit 24" should have an area ratio in excess of the 2:1 ratio used by stage 24' so that a gain-reducing signal is not applied to the first amplifier stage 10 until the signal on lines 18, 20 exceeds, for example, 50 millivolts.

It will be recognized that either of the foregoing arrangements (cascading one AGC control circuit after another, or operating several AGC control circuits from a common input signal) can be extended to use with an arbitrarily large number of gain stages. It will also be recognized that the present invention can be incorporated as an integral part of a gain stage and need not appear as a separate circuit element. By using such a construction technique, the same lines 18, 20 can be run to all of the gain stages, and the responses of the gain stages will depend on the area ratios of the transistors used therein.

Figure 5:
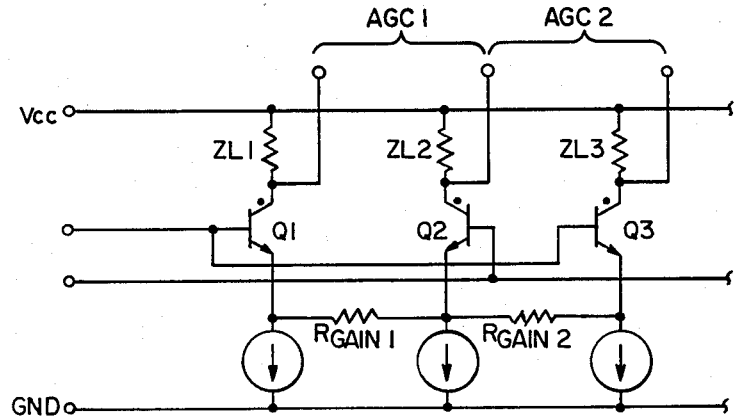
FIG. 5 is an electrical schematic diagram showing AGC circuitry to control two stages independently.

While the AGC control circuit of FIG. 3 can be replicated as many time as there are stages needing different AGC voltages, the circuit of FIG. 5 can alternatively be used. It will be recognized that the transistors $Q_1$ and $Q_2$ in FIG. 5 are arranged in substantially the same fashion as are the transistors in FIG. 3. The AGC control voltage for the first gain-controlled stage is taken from their output terminals.

A second AGC voltage is produced in FIG. 5 by making a double use of $Q_2$. That is, a second AGC control circuit is formed simply by adding one more transistor, $Q_3$, to the circuit and taking the second AGC voltage from the outputs of $Q_2$ and $Q_3$. (This arrangement assumes, of course, that the current drawn by the gain-controlled amplifiers from the AGC lines is negligible so as to not upset circuit operation).

The topology used in FIG. 5 again is shown with an optional gain determining resistor $R_{gain1}$ interposed between the emitters of transistors $Q_1$ and $Q_2$. The ratio of the load resistors $Z_{L1}$, $Z_{L2}$ to $R_{gain1}$ can be selected to control the slope of the gain reduction curve (i.e. such as those shown in FIG. 2), and thus the rate at which gain reduction occurs for a given change in received signal strength.

Most FM communications receivers are typically not gain controlled. Instead, their amplifiers are run at maximum amplification and gain control is effected by hard clipping or limiting of the amplified signal. It has been found in the present application, which uses a relatively small aperture antenna in a wristwatch paging receiver, that the effects of multipath are minimized if the receiver is gain controlled rather than relying on typical FM limiter technology.

Figure 6:
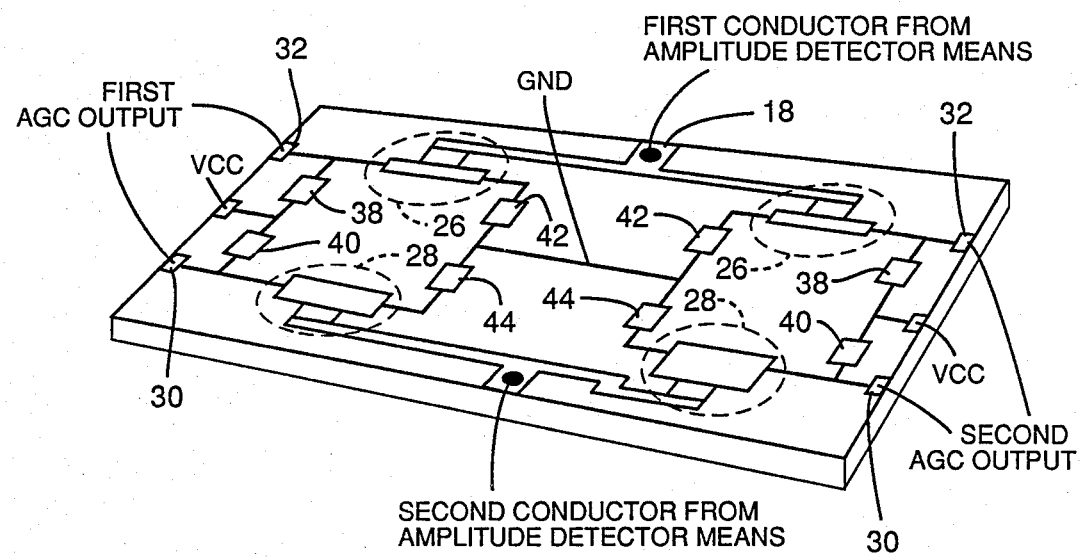
FIG. 6 is a schematic diagram showing the AGC circuitry of the present invention fabricated in integrated circuit form.

As noted earlier and shown in FIG. 6, the preferred embodiment of the invention is to use integrated circuit construction on a common substrate. Although IC fabrication techniques do not allow precise control over individual component characteristics, very good control can be obtained between the ratios of certain components. It is the controlled ratioing between components that permits the characteristics of the present invention to be accurately tailored, not the absolute value of any component per se.

From the foregoing, it will be recognized that the present invention can accurately and repeatably sequence the onset of gain reduction in a series of gain controlled amplifiers implemented on an integrated circuit for the purpose of maximizing the dynamic range of the resultant amplifier chain. This sequencing, or delaying the onset of gain reduction to the input stage.

Having illustrated the principles of my invention with reference to a preferred embodiment and several variations thereof, it should be apparent to one of ordinary skill in the art that the invention can be modified in arrangement and detail without departing from such principles. For example, while differential circuitry has been illustrated and is preferred for purposes of noise immunity, the principles of the invention can also be practiced using single-ended circuit topologies. Likewise, while the diagrams have showed the AGC control circuits configured as common emitter amplifiers, other topologies, such as common base amplifiers, could alternatively be used. Similarly, diodes can be used for loads 38 and 40 in FIG. 3 to introduce a non-linear effect into the circuit's response. Finally, the use of the present invention in an FM receiver is illustrative only, since it is equally useful in a variety of other receiver and amplifier designs. Accordingly, I claim as my invention all such modifications as may come within the scope and spirit of the following claims.

I claim:

1. A circuit for providing a first AGC signal to a first amplifier and a different, second AGC signal to a second amplifier, said first and second amplifiers being cascaded in a radio receiver, the circuit comprising:
   amplitude detector means for producing on first and second conductors a differential signal related to the amplitude of signal output from said cascaded amplifiers;
   first, second and third transistors, each of said transistors having an input terminal, an output terminal and a bias terminal;
   said first and third transistors each having their input terminal coupled to said first conductor from the amplitude detector means;
   second transistor having its input terminal coupled to said second conductor from the amplitude detector means;
   the output terminals of the first and second transistors providing the first AGC signal;
   the output terminals of the second and third transistors providing the second AGC signal;
   and in which the ratio of saturation currents between the first and second transistors does not equal the ratio of saturation currents between the second and third transistors.

2. A circuit for providing a first AGC signal to a first amplifier and a different, second AGC signal to a second amplifier, said first and second amplifiers being cascaded in a radio receiver, the circuit comprising:
   amplitude detector means for producing on first and second conductors a differential signal related to the amplitude of signal output from said cascaded amplifiers;
   first and second control stages, each of said control stages comprising first and second transistors in differential configuration, each of said transistors having an input terminal, an output terminal and a bias terminal;
   each of said first transistors having their input terminal coupled to said first conductor from the amplitude detector means;
   each of said second transistors having their input terminal coupled to said second conductor from the amplitude detector means;
   the output terminals of the transistors in said first control stage providing the first AGC signal;
   the output terminals of the transistors in said second control stage providing the second AGC signal;
   and in which the ratio of saturation currents between the first and second transistors in the first control stage does not equal the ratio of saturation currents between the first and second transistors in the second control stage.

3. The circuit of claim 2 in which:
   the first control stage includes first and second load elements interposed between a power supply line and the output terminals of the first and second transistors;
   a third load element is interposed between the bias terminals of said first and second transistors;
   and in which the rate at which the first AGC signal changes as a function of changes in the differential signal provided from the amplitude detector means is set by the ratios between the impedances of the first and second load elements to the impedance of the third load element.

4. The circuit of claim 2 in which said first and second control stages are fabricated in integrated circuit form on a common substrate and in which said transistors are of different areas to achieve the difference in saturation current ratios.

5. A circuit for producing an AGC signal for application to a gain-controlled amplifier in a radio receiver comprising:
   differential control stage means having first and second transistors in a differential configuration, the inputs of said transistors receiving an input signal related to the amplitude of the signal being received by the receiver, and the output of said control stage means providing an AGC output signal for application to the gain-controlled amplifier, said first and second transistors having different areas and thus different saturation currents to yield a zero volt output signal when a certain non-zero volt differential signal is applied to their inputs.

6. The circuit of claim 5 in which the first and second transistors are fabricated in integrated circuit form on a common substrate.

7. A circuit according to claim 5 in which said inputs are the bases of said transistors and in which said outputs are the collectors.

8. The circuit of claim 5 which further includes means for establishing the rate at which the AGC output signal changes as a function of changes in the input signal.

9. The circuit of claim 5 in which the inputs of said transistors receive a differential input signal related to the amplitude of the signal being received by the receiver, and the outputs of said transistors provide a differential AGC output signal for application to the gain controlled amplifier.

10. In a method of controlling the gains of first and second amplifiers in a radio receiver, an improvement permitting the onset of significant gain reduction in the first amplifier to be staggered from the onset of significant gain reduction in the second amplifier as a function of received signal strength, comprising the steps:

providing first and second AGC circuits for providing AGC signals to said first and second amplifiers, said AGC circuits having a plurality of components and having identical topologies, said circuits both being driven from a common signal source; and fabricating said circuits in integrated circuit form on a common substrate with the area of one component in the first AGC circuit being fabricated to have a desired non-unity area ratio relationship with the same component in the second AGC circuit, said non-unity area ratio effecting the staggering of the onset of significant gain reduction in the first amplifier from the onset of significant gain reduction in the second amplifier as a function of the received signal strength.

* * * * *